(12) United States Patent
Furukawa et al.

(10) Patent No.: US 7,948,057 B2
(45) Date of Patent: May 24, 2011

(54) ELECTRONIC COMPONENT MODULE

(75) Inventors: Hirotada Furukawa, Tokyo (JP); Sayuri Terasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 170 days.

(21) Appl. No.: 12/275,817

(22) Filed: Nov. 21, 2008

(65) Prior Publication Data

US 2009/0134490 A1    May 28, 2009

(30) Foreign Application Priority Data

Nov. 28, 2007    (JP) ................. P2007-307172

(51) Int. Cl.
*H01L 27/08*    (2006.01)
(52) U.S. Cl. ................. 257/531; 257/686; 257/E23.064
(58) Field of Classification Search ............ 257/531, 257/686
See application file for complete search history.

(56) References Cited

U.S. PATENT DOCUMENTS

| | | | |
|---|---|---|---|
| 5,976,910 A * | 11/1999 | Tamura et al. | 438/107 |
| 6,876,554 B1 * | 4/2005 | Inagaki et al. | 361/763 |
| 7,473,992 B2 * | 1/2009 | Ogawa | 257/686 |
| 2002/0090162 A1 * | 7/2002 | Asada et al. | 385/14 |
| 2005/0017347 A1 * | 1/2005 | Morimoto et al. | 257/703 |
| 2005/0051883 A1 * | 3/2005 | Fukazawa | 257/686 |
| 2007/0132060 A1 * | 6/2007 | Kuwajima et al. | 257/530 |
| 2007/0230042 A1 * | 10/2007 | Fujiwara | 360/123 |
| 2008/0003408 A1 * | 1/2008 | Masai et al. | 428/161 |
| 2008/0055859 A1 * | 3/2008 | Furukawa et al. | 361/704 |
| 2008/0055873 A1 * | 3/2008 | Mi et al. | 361/761 |
| 2008/0283279 A1 * | 11/2008 | Ogawa | 174/255 |
| 2011/0012803 A1 * | 1/2011 | Yosui et al. | 343/788 |

FOREIGN PATENT DOCUMENTS

| | | |
|---|---|---|
| JP | A-2002-233140 | 8/2002 |
| JP | A-2007-195286 | 8/2007 |

* cited by examiner

*Primary Examiner* — A. Sefer
(74) *Attorney, Agent, or Firm* — Oliff & Berridge, PLC

(57) ABSTRACT

A ferrite substrate, a winding-embedded ferrite resin layer, and an IC-embedded ferrite resin layer are laminated, the ferrite substrate has a ferrite first protruding part that protrudes into the ferrite resin layer from the surface thereof, the winding inside the ferrite resin layer is arranged winding around the first protruding part, and the IC overlaps the first protruding part in the resin layer. According to this configuration, high integration can be achieved, and the IC is arranged at a site where the ferrite first protruding part, the height of which fluctuates little as a result of thermal expansion, overlaps the ferrite resin layer, the thickness of which is thinned by the first protruding part and varies little as a result of thermal expansion, minimizing variations in the gap between the winding and the IC as a result of thermal expansion, and achieving greater stability of electrical characteristics.

6 Claims, 14 Drawing Sheets

ELECTRONIC COMPONENT MODULE

BACKGROUND OF THE INVENTION

1. Field of the Invention

The present invention relates to an electronic component module, and more particularly to an electronic component module in which a winding and an IC are embedded in a resin layer on the surface of a substrate.

2. Related Background Art

In recent years, small electronic devices such as mobile telephones have been configured using various electronic component modules that combine an inductor, a capacitor and other such elements with an IC. The high degree of component integration in electronic devices like mobile telephones seems without limits, and ever higher integration is being demanded in electronic component modules. For example, Japanese Patent Laid-open No. 2002-233140 discloses a micro power converter device, in which, subsequent to forming a winding that constitutes an inductor on a ferrite substrate and subjecting the winding to resin molding to inhibit the occurrence of saturation magnetization, a semiconductor substrate of a micro power circuit IC is laminated on top of the ferrite substrate that forms the winding.

However, the demand for higher integration and stable electrical characteristics in electronic devices knows no bounds, and there is demand for ever higher integration and more stable electrical characteristics in the electronic component module for use in power conversion described above.

SUMMARY OF THE INVENTION

The present invention was made with this situation in view, and an object of the present invention is to provide an electronic component module that satisfies the demands for both high integration and stable electrical characteristics.

The present invention is an electronic component module that comprises a substrate; a winding-embedded first resin layer, which is disposed on top of the substrate; and an IC-embedded second resin layer, which is disposed on top of the first resin layer, the substrate having a first protrusion which is made of ceramics and protrudes into the first resin layer from the surface of the substrate, the winding is arranged inside the first resin layer so as to wind around the circumference of the first protrusion, and the IC is arranged in the second resin layer so as to overlap the first protrusion.

According to this configuration, since the substrate, the winding-embedded first resin layer and the IC-embedded second resin layer are laminated, higher integration can be achieved than in a mounting format in which an inductor and IC are discretely mounted on top of a substrate. Further, according to this configuration, since the substrate has a first protrusion which is made of ceramics and protrudes into the first resin layer from the surface of the substrate, and the winding is arranged inside the first resin layer so as to wind around the circumference of the first protrusion, this first protrusion can be made to play the role of a core that serves as the core coil. Furthermore, since the IC is arranged inside the second resin layer so as to overlap the first protrusion, electrical characteristics can be made more stable because the IC is arranged at the site where the first protrusion made of ceramics, the height of which fluctuates little as a result of thermal expansion, and the first resin layer, the thickness of which is thinned by the first protrusion and varies little as a result of thermal expansion, sequentially overlap, minimizing variations in the gap between the winding and the IC as a result of thermal expansion. Specifically, since the interconnect distance between the IC and inductor, which serve as the electronic component module for use in power conversion, is stable, deviations in resistance to noise caused by interconnect extension are held in check, making the interconnect distance between the IC and the inductor more stable, which in turn stabilizes the way heat propagates from the IC thereby also stabilizing electrical characteristics arising from the affects of heating during IC operation.

In this case, the IC can be arranged such that the plane of projection of the IC on the surface of the substrate juts out beyond the cross-sectional area of the first protrusion at the surface of the substrate.

According to this configuration, because the plane of projection of the IC on the surface of the substrate is arranged jutting out beyond the cross-sectional area of the first protrusion at the surface of the substrate, the distance over which the outgoing interconnect of the end of the winding is connected to the IC terminal becomes relatively short, thereby making it possible to reduce power loss and lessen the affects of noise. Further, according to this configuration, the first protrusion will be relatively small in an electronic component module of equivalent size, thereby making it possible to increase the number of winds of the winding.

Or, the IC can be arranged such that the plane of projection of the IC on the surface of the substrate is on the inside of the cross-sectional area of the first protrusion at the surface of the substrate.

According to this configuration, since the plane of projection of the IC on the surface of the substrate is arranged on the inside of the cross-sectional area of the first protrusion at the surface of the substrate, the IC can be arranged more stably on top of the first protrusion, the height of which fluctuates little as a result of thermal expansion.

Meanwhile, it is preferable that the substrate further comprise a second protrusion which is made of ceramics, protrudes into the first resin layer from the surface of the substrate, and is arranged on the periphery of the winding that winds around the circumference of the first protrusion, and that an IC be arranged inside the second resin layer spanning the first protrusion and the second protrusion.

According to this configuration, since the substrate further comprises a second protrusion made of ceramics, which is arranged on the periphery of the winding that winds around the circumference of the first protrusion, and an IC is arranged inside the second resin layer spanning the first protrusion and the second protrusion, the IC is arranged on top of the first protrusion and the second protrusion, the heights of which fluctuate little as a result of thermal expansion, enabling the IC to be arranged more stably.

Figure 6:
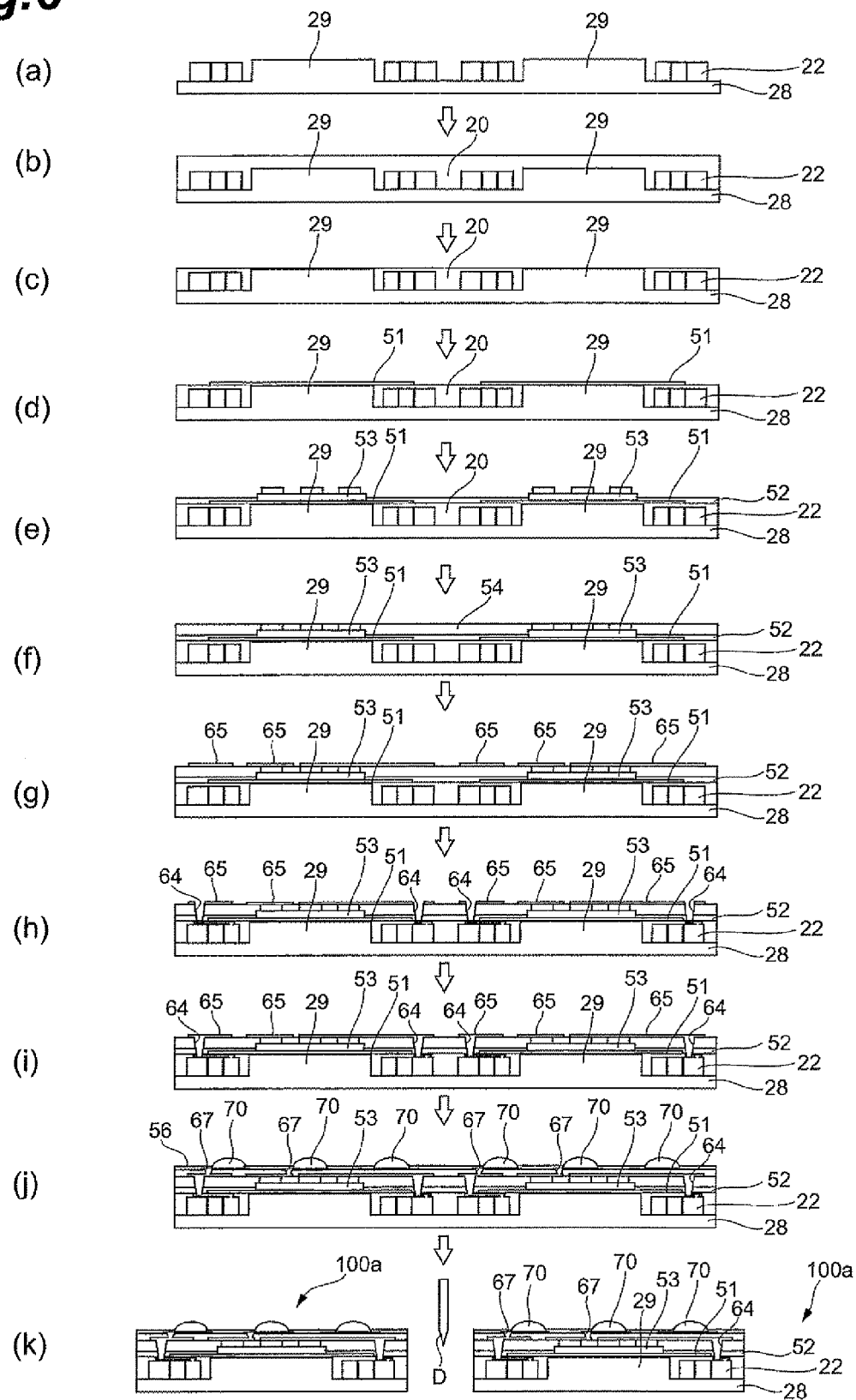
Figure 7:
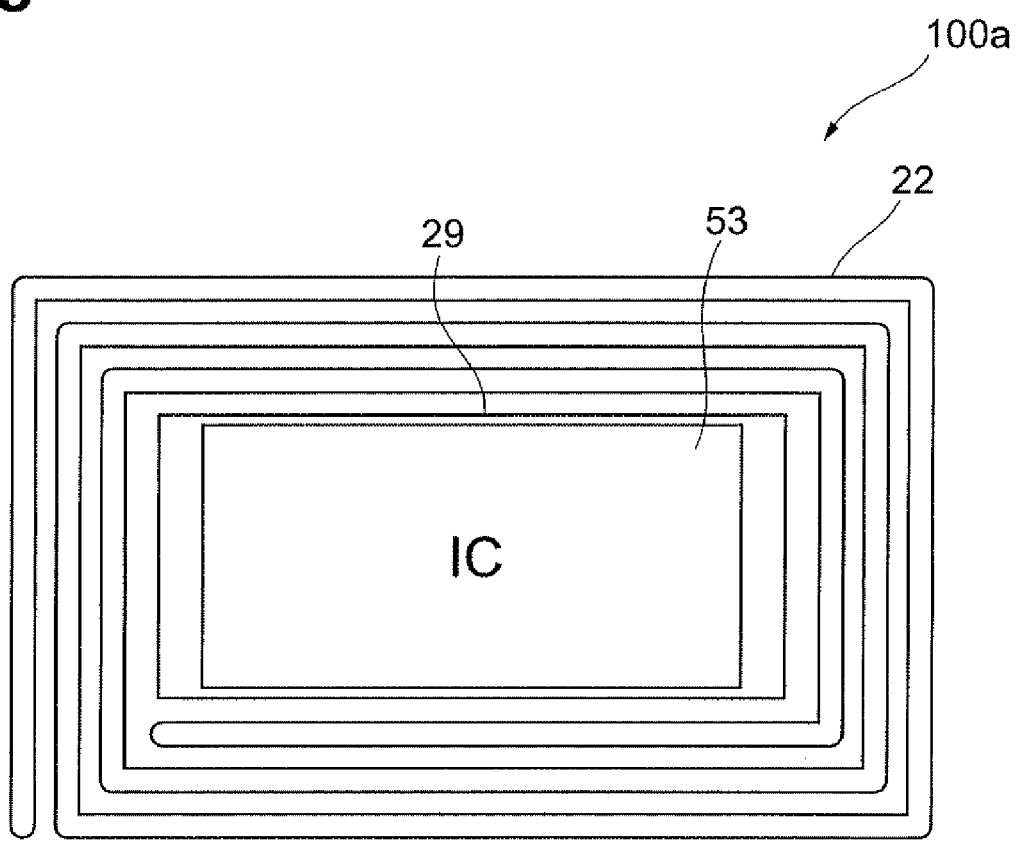
Figure 8:
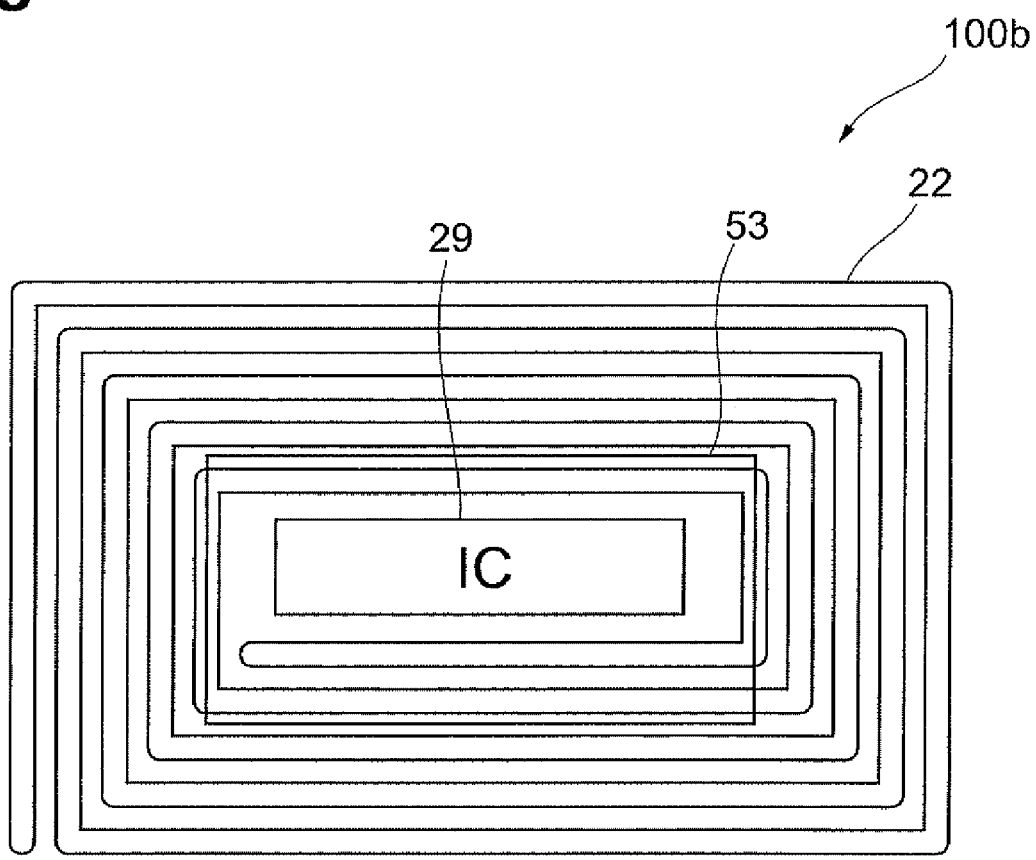
Figure 9:
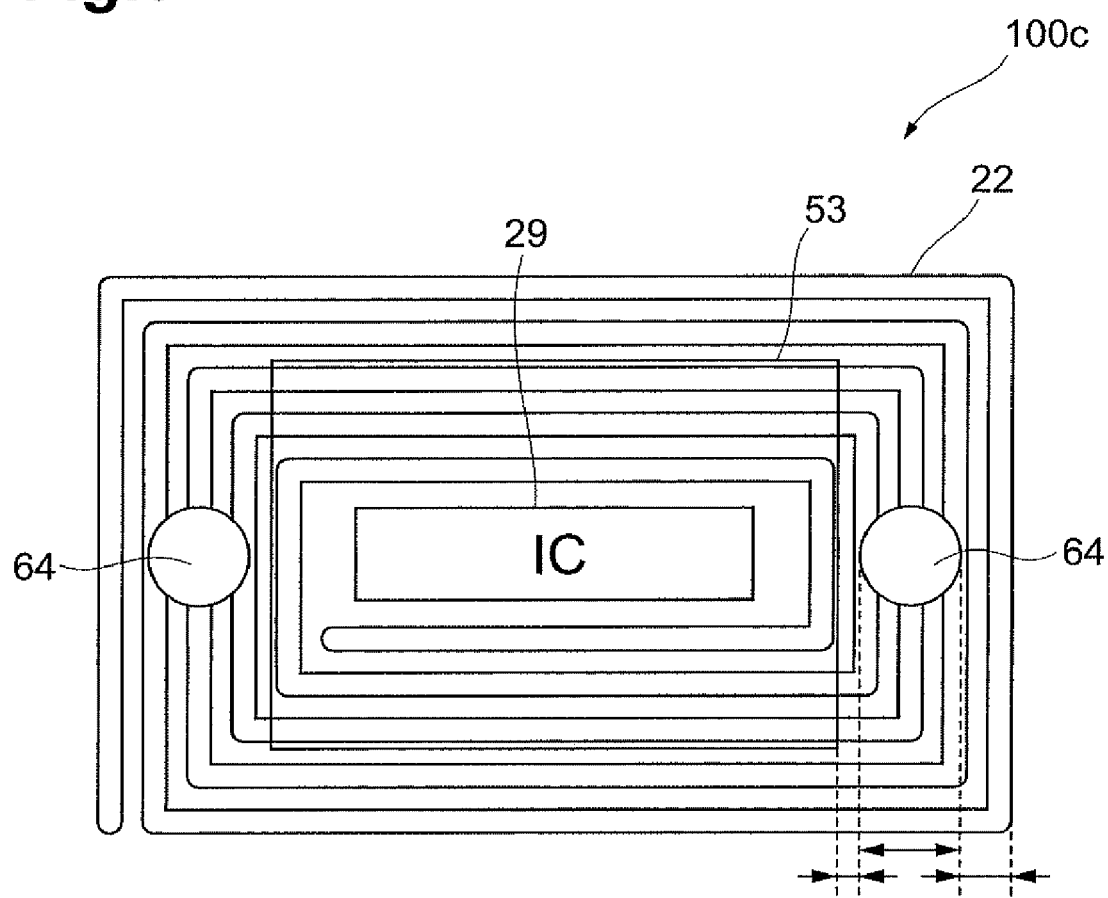
Figure 10:
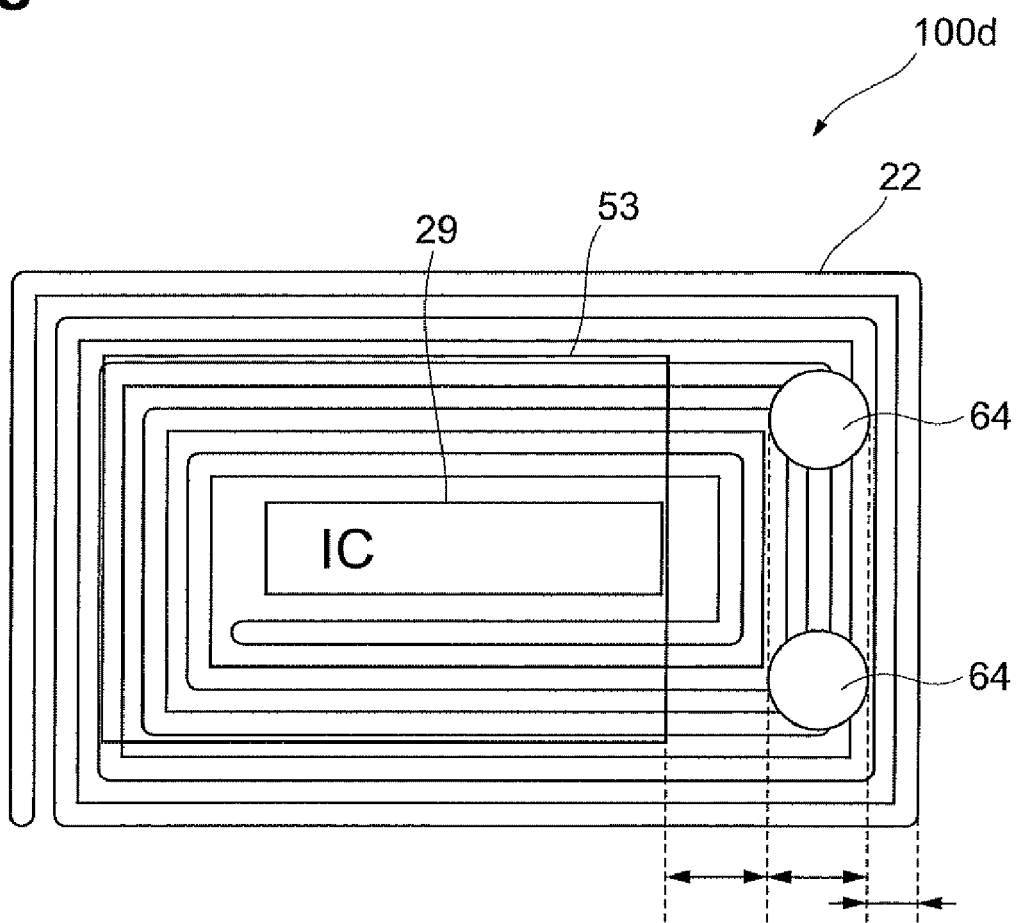
Figure 11:
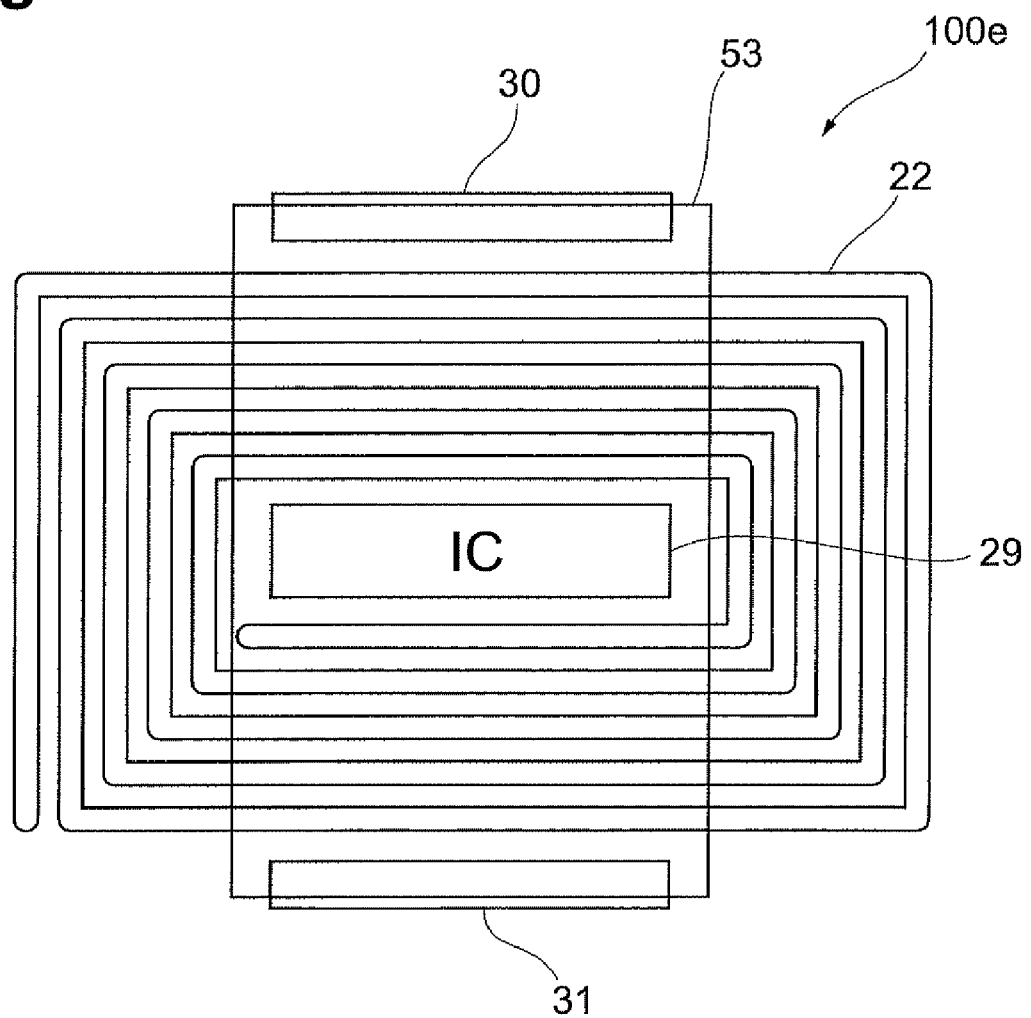
Figure 12:
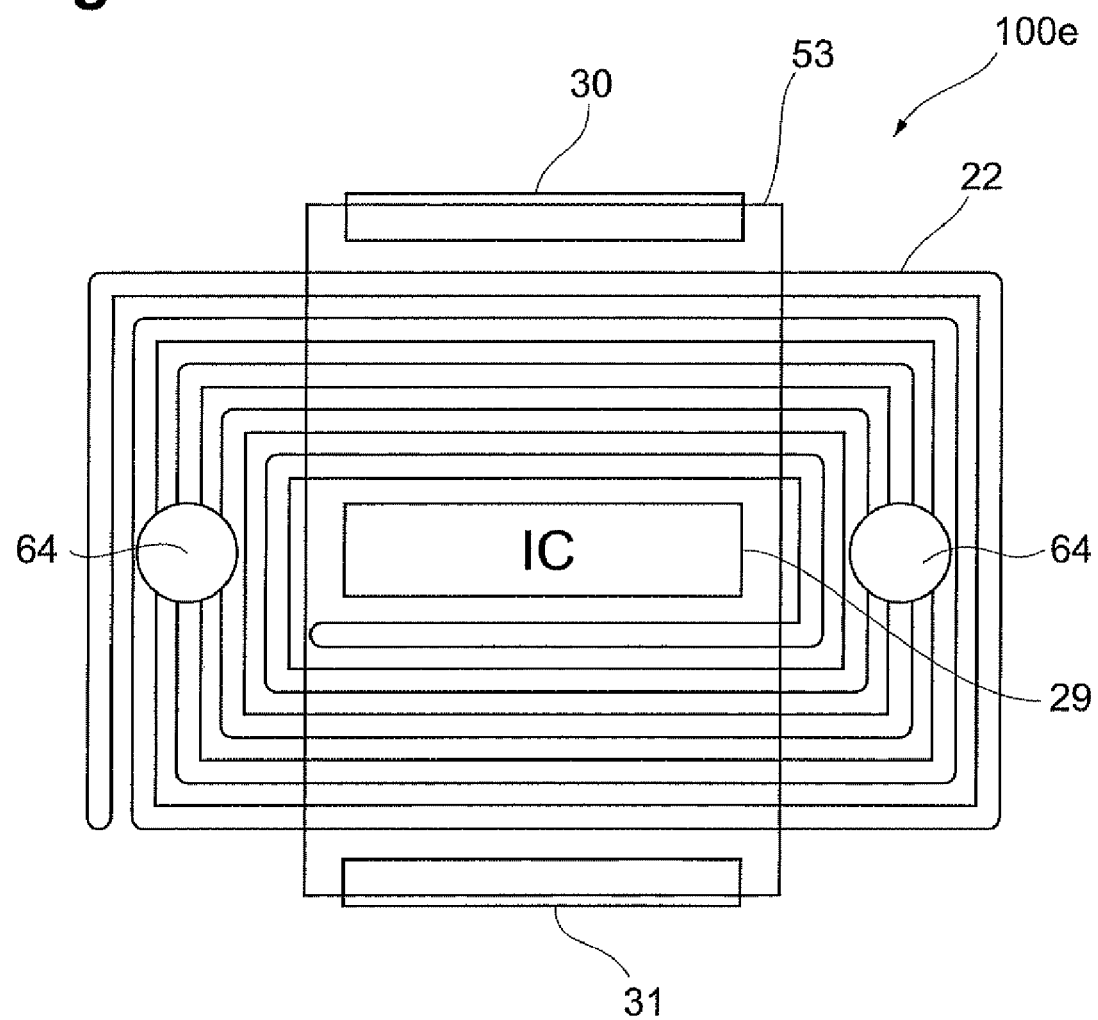
Figure 13:
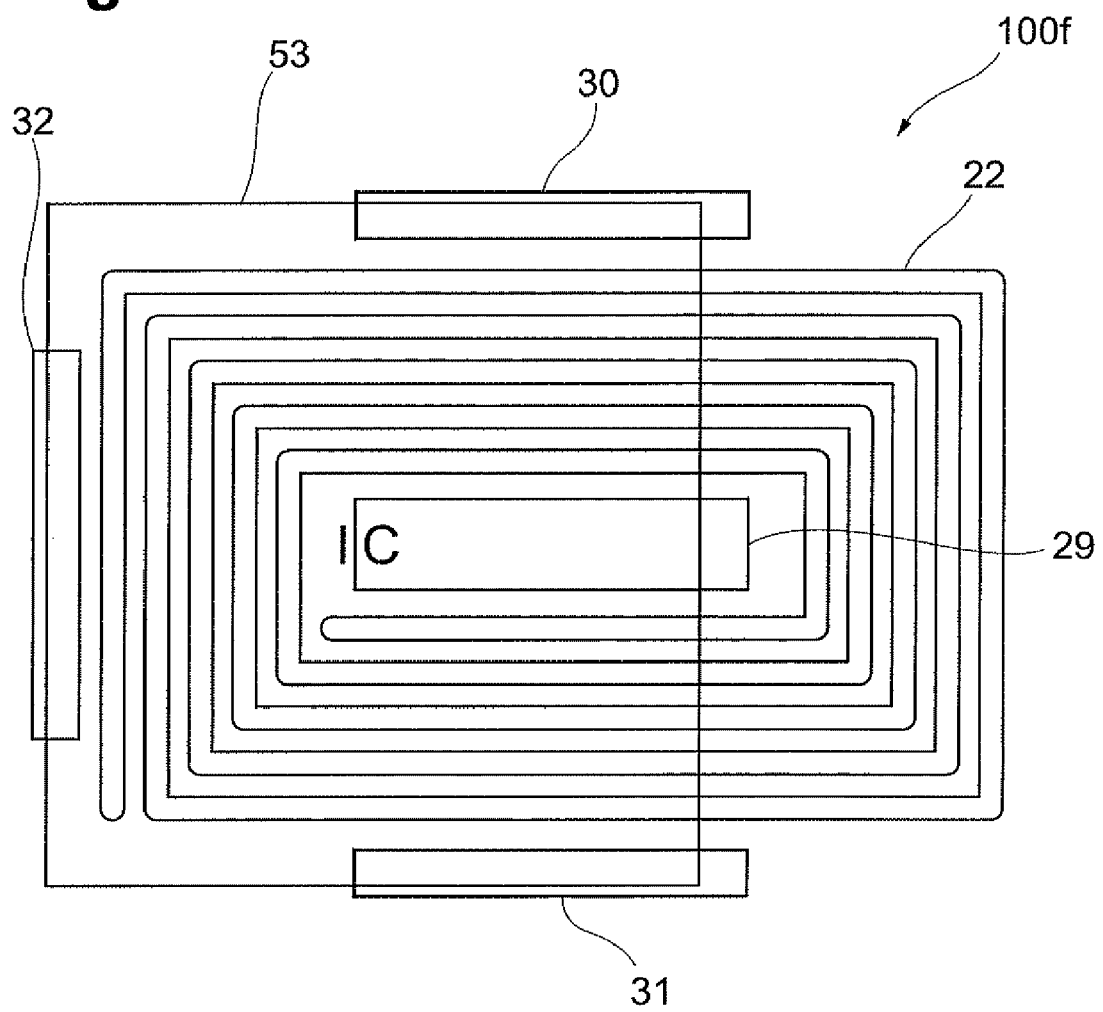
Figure 14:
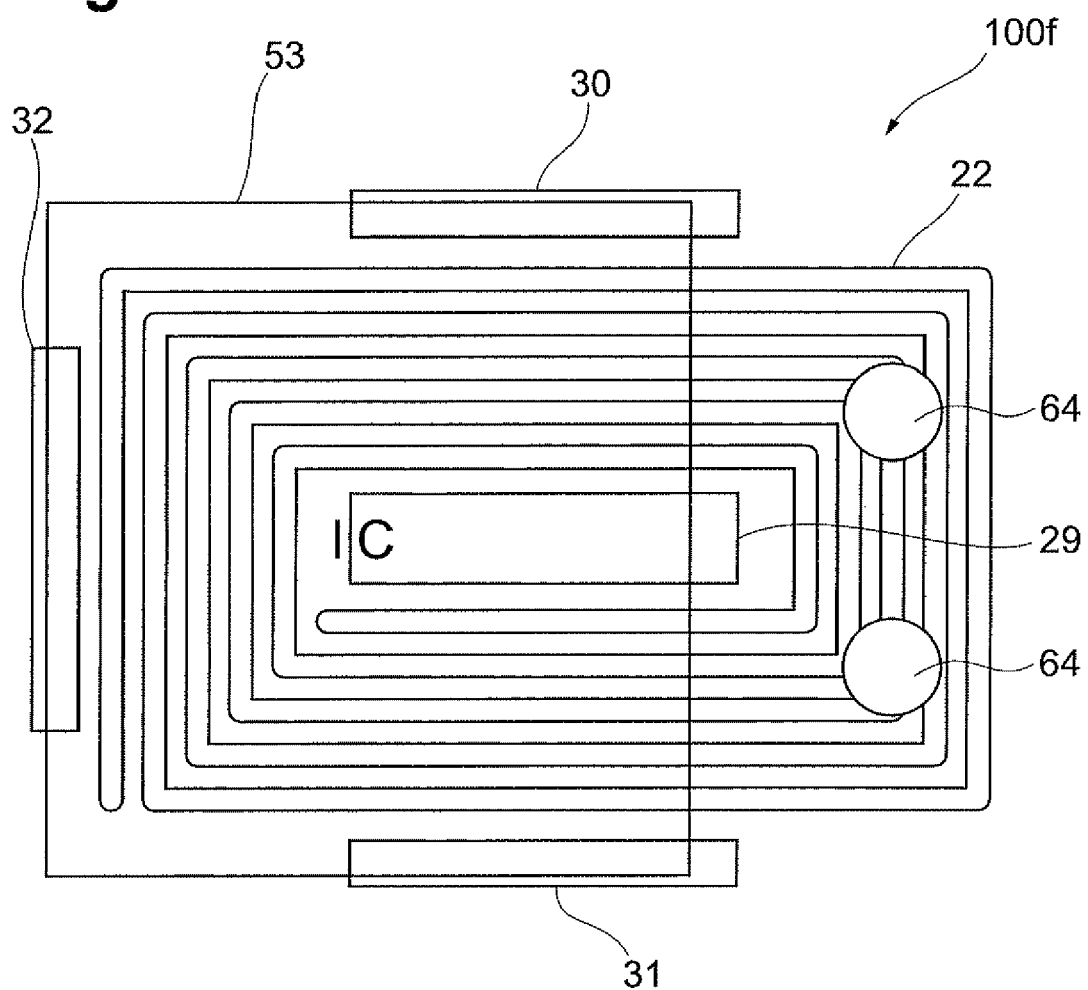

(a) of FIG. 6 through (k) of FIG. 6 are diagrams showing the fabrication processes for a passive component;

FIG. 7 is a diagram showing the size relationship between an IC and a first protrusion in the electronic component module of the first embodiment;

FIG. 8 is a diagram showing the size relationship between an IC and a first protrusion in an electronic component module of a second embodiment;

FIG. 9 is a diagram showing the positional relationship between an IC and a first protrusion in an electronic component module of a third embodiment;

FIG. 10 is a diagram showing the positional relationship between an IC and a first protrusion in an electronic component module of a fourth embodiment;

FIG. 11 is a diagram showing the positional relationships among an IC, a first protrusion, and a second protrusion in an electronic component module of a fifth embodiment;

FIG. 12 is a diagram showing the positional relationships among an IC, a first protrusion, a second protrusion, and vias in the electronic component module of the fifth embodiment;

FIG. 13 is a diagram showing the positional relationships among an IC, a first protrusion, and a second protrusion in an electronic component module of a sixth embodiment; and FIG. 14 is a diagram showing the positional relationships among an IC, a first protrusion, a second protrusion, and vias in the electronic component module of the sixth embodiment.

DESCRIPTION OF THE PREFERRED EMBODIMENTS

Electronic component modules related to the embodiments of the present invention will be explained hereinbelow by referring to the attached figures.

Figure 1:
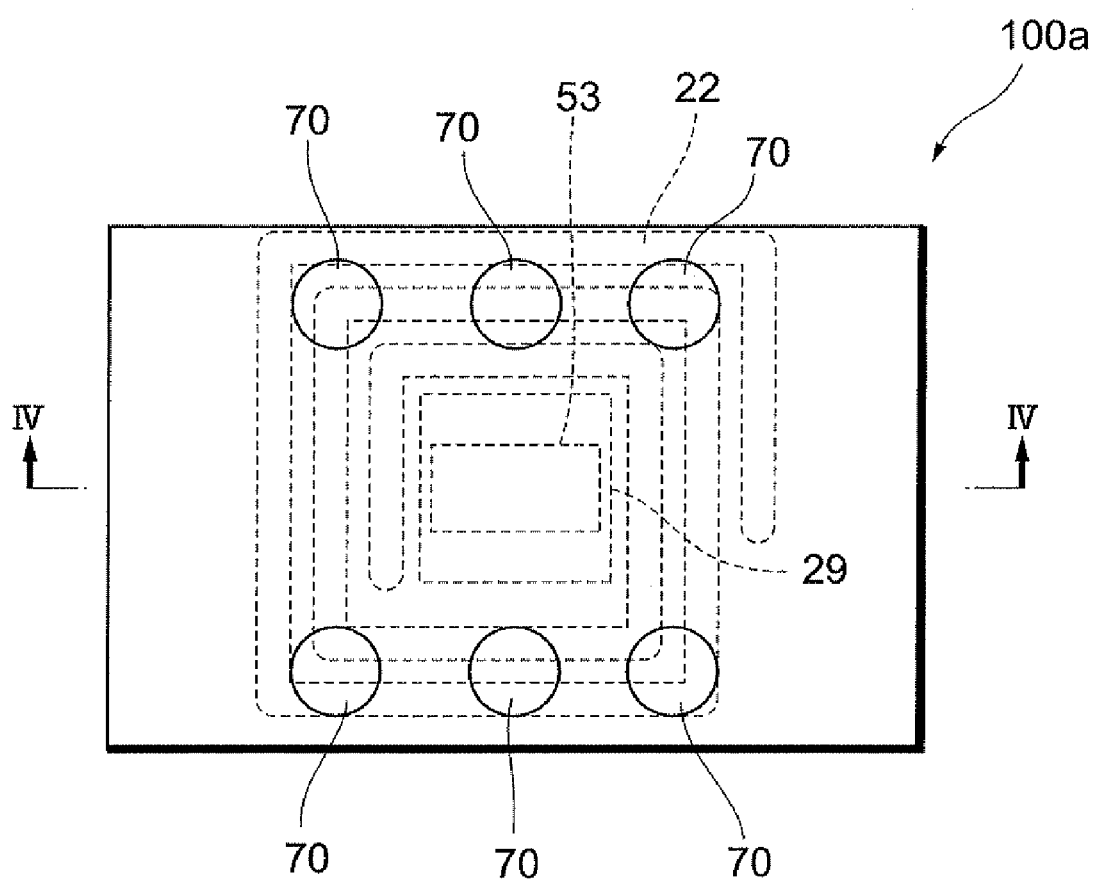
FIG. 1 is a plan view of an electronic component module of a first embodiment.
Figure 2:
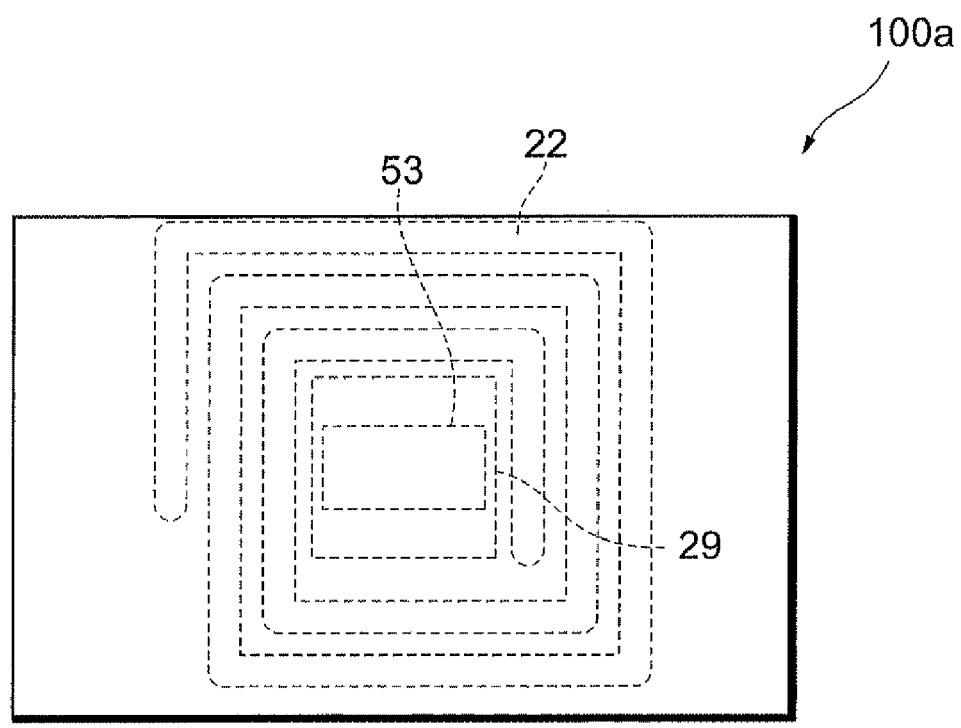
FIG. 2 is a bottom view of the electronic component module of the first embodiment.
Figure 3:
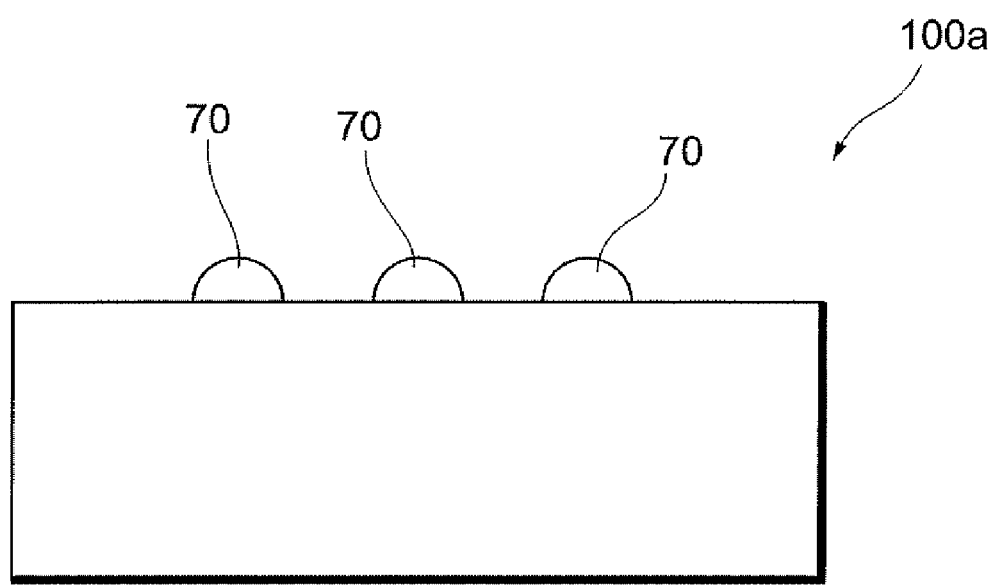
FIG. 3 is a side view of the electronic component module of the first embodiment.
Figure 4:
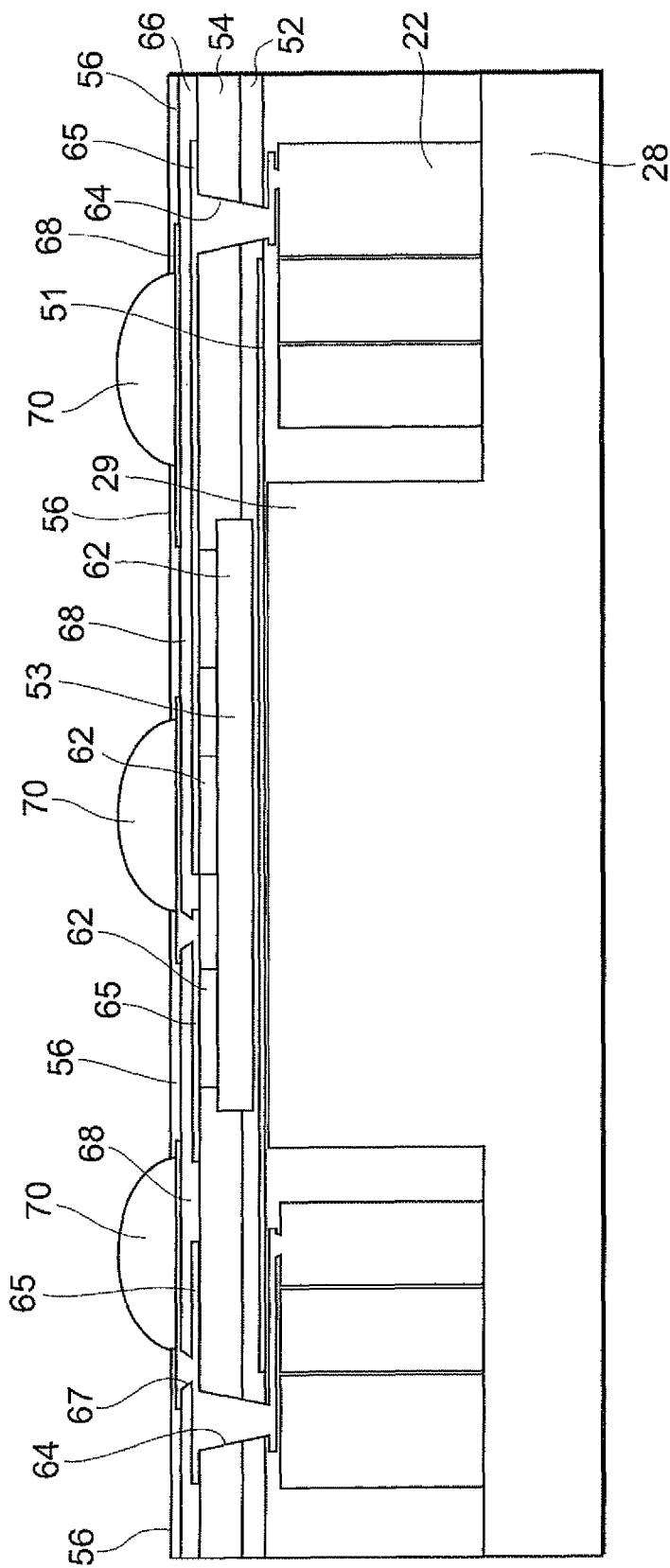
FIG. 4 is a vertical cross-sectional view along line IV in FIG. 1.
Figure 5:
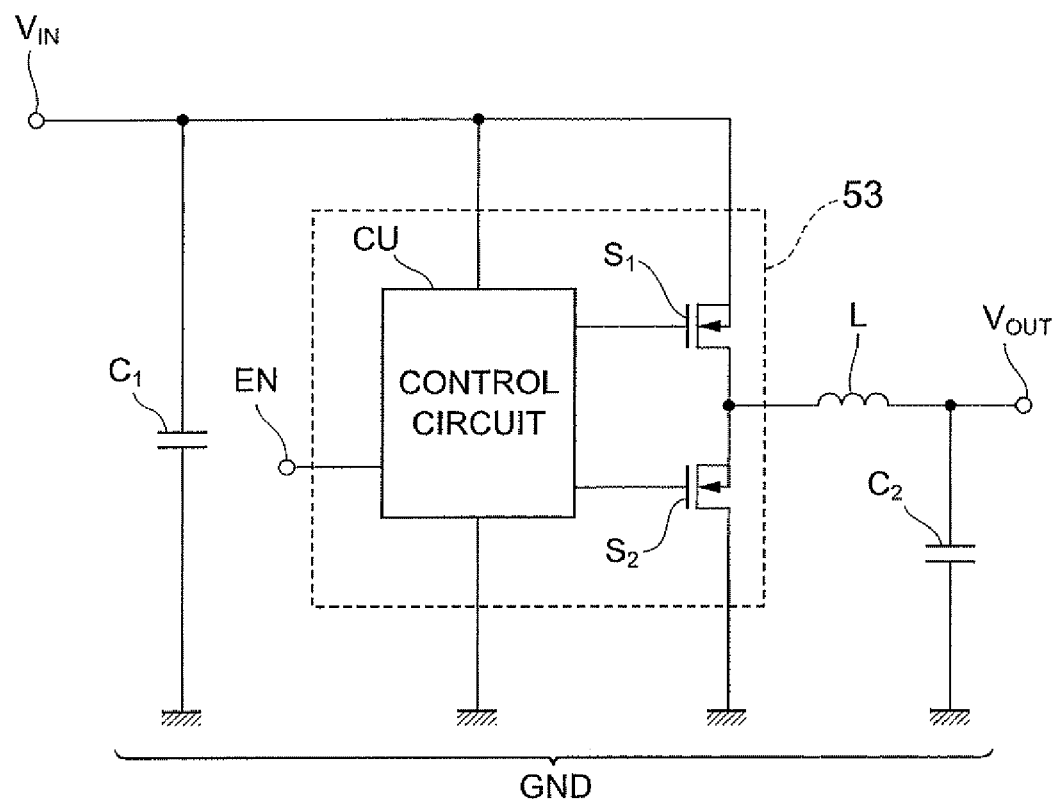
FIG. 5 is a typical circuit diagram of a DC-DC converter in accordance with the electronic component module of the first embodiment.

FIG. 1 is a plan view of an electronic component module of a first embodiment, FIG. 2 is the bottom view thereof, FIG. 3 is the side view thereof, and FIG. 4 is a vertical cross-sectional view along line IV in FIG. 1. As shown in FIGS. 1 through 4, the electronic component module 100*a* of this embodiment is embedded with a winding 22, which constitutes an inductor, and an IC 53 inside an integrated substrate, and, for example, fulfills the function of a DC-DC converter or the like in a mobile telephone power circuit. FIG. 5 shows a typical circuit diagram of this DC-DC converter.

As shown in FIGS. 1 through 3, the electronic component module 100*a* constitutes a planar shape overall, and is between 1.5 and 7.5 mm wide, between 1.0 and 6.1 mm long, and up to 1.2 mm high. An arbitrary number of solder bumps 70 is arranged on the upper surface of the electronic component module 100*a*, and electrically connected to the IC 53 and winding 22 on the inside of the electronic component module 100*a*.

As shown in FIG. 4, the electronic component module 100*a* of the present invention comprises a ferrite substrate (substrate) 28; a ferrite resin layer (first resin layer) 20 embedded with a winding 22; and resin layers (second resin layer) 52 and 54 embedded with an IC 53. A first protruding part (first protrusion) 29 made of ferrite is disposed in the ferrite substrate 28 so as to protrude inside the ferrite resin layer 20 from the surface of the ferrite substrate 28. The first protruding part 29 functions as the magnetic core of an inductor. As shown in FIGS. 1 and 2, a cross-section of the first protruding part 29 at the surface of the ferrite substrate 28 forms a rectangle in this embodiment, but this shape can also be circular or elliptical. Further, the upper end of the first protruding part 29 (the end on the opposite side of the ferrite substrate 28) stabilizes and supports the IC 53, and as such has a planar surface that runs parallel to the surface of the ferrite substrate 28.

The ferrite resin layer 20 has the function of enhancing the magnetic permeability of the inductor. The winding 22 is arranged inside the ferrite resin layer 20 so as to wind around the circumference of the first protruding part 29 as shown in FIGS. 1 and 2. As shown in FIG. 4, the upper end of the winding 22 (the end on the opposite side of the ferrite substrate 28) is lower than the upper end of the first protruding part 29 in order to maintain the working accuracy of the electronic component module 100*a* in the height direction at the time of fabrication. Furthermore, in this embodiment, the winding 22 is a planar spiral coil that winds around the circumference of the first protruding part 29 in only one layer in the horizontal direction parallel to the surface of the ferrite substrate 28, but, for example, it is also possible to make the configuration a multi-layer spiral coil in which a plurality of windings that wind around the circumference of the first protruding part 29 in the horizontal direction in only one layer are stacked up, and the windings of the respective layers are electrically connected. Or, the winding 22 can also be configured as a solenoid coil that is wrapped around the first protruding part 29 in the shape of a solenoid in the long direction (the direction of the opposite side of the ferrite substrate 28).

A soft magnetic metallic thin-film 51 is disposed in the vicinity of the first protruding part 29 between the ferrite resin layer 20 and the resin layer 52. Disposing the soft magnetic metallic thin-film 51 between the inductor resulting from the winding 22 and the IC 53 makes it possible to prevent the noise of the IC 53 from entering the inductor. Further, since the soft magnetic metallic thin-film 51 can be made thinner than in a case when ferrite is used for shielding, the size of the electronic component module 100*a* can be reduced in the height direction.

The IC 53, which fulfills the function of a switching circuit or the like, is embedded inside resin layers 52 and 54. As shown in FIGS. 1 and 2, in this embodiment, the IC 53 is arranged inside the resin layers 52, 54 such that the entire plane of projection of the IC 53 on the ferrite substrate 28 overlaps with the cross-section of the first protruding part 29 at the surface of the ferrite substrate 28. Furthermore, the IC 53 plane of projection on the ferrite substrate 28 is arranged on the inside of the cross-sectional area of the first protruding part 29 at the surface of the ferrite substrate 28.

As shown in FIG. 4, a copper foil layer 65, resin layer 66, copper foil layer 68 and resist 56 are sequentially laminated on the surface of the resin layer 54. A solder bump 70 disposed on the surface of the resist 56 is connected electrically with the winding 22 by way of copper embedded in a via 64 disposed in the resin layers 52, 54, the copper foil layer 65, copper embedded in a via 67, and copper foil layer 68. Further, a number of solder bumps 70 are electrically connected to the IC 53 by way of an IC bump 62, the copper foil layer 65, copper embedded in the via 67, and the copper foil layer 68. Furthermore, the IC 53 and the winding 22 are also electrically connected by way of the IC bump 62, copper foil layer 65, and copper embedded in the via 64 disposed in the resin layers 52, 54. Thanks to an outgoing interconnect being directly connected electrically to the IC 53 and winding 22, it is possible to arrange the IC 53 and inductor L in the circuit diagram shown in FIG. 5 so that the distance between them is the minimal length, and by arranging the solder bumps 70 at minimal distances along the extension of this interconnect and in the same orientation as the IC bumps, not only promises higher integration, but can also heighten the efficiency of the DC-DC converter. Furthermore, the arrangement of the solder bumps 70 in this embodiment is one example, and is not particularly limited to the configuration shown in the figure.

(a) of FIG. 6 through (k) of FIG. 6 are diagrams showing the fabrication process for a passive component. As shown in (a) of FIG. 6, a winding is directly formed on the ferrite substrate 28 having a plurality of first protruding parts 29 by forming a copper foil layer patterned in a planar spiral coil shape. As shown in (b) of FIG. 6, a ferrite resin layer 20 is formed using a ferrite resin to fill in the gaps between the winding 22 and the first protruding parts 29. As shown in (c) of FIG. 6, the surface of the ferrite resin layer 20 (the surface on the opposite side of the ferrite substrate 28) is subjected to a planarization process, forming a planar surface on the ferrite resin layer 20. As shown in (d) of FIG. 6, sputtering is used to form a soft magnetic metallic thin-film 51 on the surface of the ferrite resin layer 20 to produce an inductor substrate.

As shown in (e) of FIG. 6, after applying a sheet-shaped resin to the surface of the ferrite resin layer 20, and subjecting this resin to vacuum lamination and planarization processing to form a resin layer 52, IC 53, on which IC bumps 62 have been formed beforehand, and which have been made into individual dies from a wafer, are arranged on the surface of the resin layer 52 (the surface on the opposite side of the ferrite substrate 28). As shown in (f) of FIG. 6, a sheet-shaped resin is applied on top of the surface of the resin layer 52 and the IC 53 and subjected to vacuum lamination processing, thereby embedding the IC 53 inside resin layers 52 and 54.

As shown in (g) of FIG. 6, after applying copper foil on top of the resin layer 54 and carrying out vacuum lamination processing, a copper foil layer 65, which constitutes an interconnect layer for electrically connecting the winding 22 and IC 53 to the outside, is formed by a photolithographic pattern etching process. As shown in (h) of FIG. 6, vias 64 are formed using a wet blasting process to expose the IC bumps 62 of the IC 53 and the terminal part of the winding 22. As shown in (i) of FIG. 6, after subjecting the vias 64 to electroless copper plating, conductors are formed inside the vias 64 by carrying out electrolytic copper plating.

As shown in (j) of FIG. 6, the processes of (f) of FIG. 6 through (i) of FIG. 6 are repeated to form a resin layer 66, a copper foil layer 68 and vias 67, and to subject the insides of the vias 67 to copper plating, and thereafter, a resist 56 is applied, and solder bumps 70 are formed. As shown in (k) of FIG. 6, individual electronic component modules 100a are produced by subjecting the ferrite substrate 28 to dicing.

According to this embodiment, since the ferrite substrate 28, the winding 22-embedded ferrite resin layer 20, and the IC 53-embedded resin layers 52, 54 are laminated, higher integration can be achieved than in a mounting format in which an inductor and IC are discretely mounted on top of a substrate. Further, according to this embodiment, since the ferrite substrate 28 has a first protruding part 29 made of ferrite that protrudes into the ferrite resin layer 20 from the surface of the ferrite substrate 28, and the winding 22 is arranged inside the ferrite resin layer 20 so as to wind around the circumference of the first protruding part 29, this first protruding part 29 can be made to fulfill the role of a core that serves as the core coil.

Furthermore, in this embodiment, since the IC 53 is arranged inside the resin layers 52 and 54 so as to overlap the first protruding part 29, electrical characteristics can be made more stable because the IC 53 is arranged at the site where the ferrite first protruding part 29, the height of which fluctuates little as a result of thermal expansion, and ferrite resin layer 20, the thickness of which is thinned by the first protruding part 29, and varies little as a result of thermal expansion, sequentially overlap, minimizing variations in the gap between the winding 22 and the IC 53 as a result of thermal expansion. Specifically, since the interconnect distance between the IC and inductor, which serve as the electronic component module for use in power conversion, is stable, deviations in resistance to noise caused by interconnect extension are held in check, making the interconnect distance between the IC and the inductor more stable, which in turn also stabilizes the way heat propagates from the IC, thereby also stabilizing the electrical characteristics arising from the affects of heating during IC operation.

In addition, according to this embodiment, since the plane of projection of the IC 53 on the surface of the ferrite substrate 28 is arranged on the inside of the cross-sectional area of the first protruding part 29 at the surface of the ferrite substrate 28, the IC 53 can be arranged more stably on top of the first protruding part 29, the height of which fluctuates little as a result of thermal expansion.

A second embodiment of the present invention will be explained hereinbelow. In the first embodiment described above, the plane of projection of the IC 53 on the surface of the ferrite substrate 28 is arranged on the inside of the cross-sectional area of the first protruding part 29 at the surface of the ferrite substrate 28 as shown in FIG. 7. Conversely, in an electronic component module 100b of the second embodiment, as shown in FIG. 8, the plane of projection of the IC 53 on the surface of the ferrite substrate 28 is arranged jutting out beyond the cross-sectional area of the first protruding part 29 at the surface of the ferrite substrate 28.

According to this embodiment, since the plane of projection of the IC 53 on the surface of the ferrite substrate 28 is arranged jutting out beyond the cross-sectional area of the first protruding part 29 at the surface of the ferrite substrate 28, the distance over which the outgoing interconnect of the end of the winding 22 is connected to the IC 53 terminal becomes relatively short, thereby making it possible to reduce power loss and lessen the affects of noise. Further, according to this embodiment, since the first protruding part 29 is relatively small in an electronic component module of equivalent size, the number of winds of the winding 22 can be increased.

In this case, it becomes possible to stably arrange the IC 53 by arranging the IC 53 such that the center portion of the IC 53 overlaps the center portion of the first protruding part 29 as in the electronic component module 100c of a third embodiment of the present invention shown in FIG. 9. Conversely, arranging the IC 53 by shifting the IC 53 such that the center portion of the IC 53 does not overlap the center portion of the first protruding part 29 as in the electronic component module 100d of a fourth embodiment of the present invention shown in FIG. 10 makes it possible to provide more surface area for the disposition of vias 64 than in the third embodiment shown in FIG. 9, and to enhance the degrees of freedom of the interconnects.

A fifth embodiment of the present invention will be explained hereinbelow. As shown in FIG. 11, in an electronic component module 100e of this embodiment, a pair of second protruding parts (second protrusions) 30 and 31, which are made of ferrite, are disposed on the surface of the ferrite substrate 28 in addition to the first protruding part 29, and protrude inside the ferrite resin layer 20 from the surface of the ferrite substrate 28. The second protruding parts 30 and 31 are made of ferrite the same as the first protruding part 29. The second protruding parts 30 and 31 are opposingly arranged with the first protruding part 29 between them on the periphery of the winding 22 that winds around the circumference of the first protruding part 29. The IC 53 is arranged inside resin layers 52 and 54 such that the plane of projection of the IC 53 on the surface of the ferrite substrate 28 overlaps the crosssections of the second protruding parts 30 and 31 at the surface of the ferrite substrate 28. The IC 53 is arranged such that the center portion of the IC 53 overlaps the center portion of the first protruding part 29. The arrangement of the vias 64 is shown in FIG. 12.

In this embodiment, the IC 53 is arranged on top of the first protruding part 29 and two second protruding parts 30 and 31, which fluctuate little in height as a result of thermal expansion, making it possible to more stably arrange the IC 53. Furthermore, since the IC 53 is arranged in this embodiment such that the center portion of the IC 53 overlaps the center portion of the first protruding part 29, it becomes possible to stably arrange the IC 53.

A sixth embodiment of the present invention will be explained hereinbelow. As shown in FIG. 13, in an electronic component module 100f of this embodiment, in addition to the first protruding part 29, and the second protruding parts 30 and 31, which are opposingly arranged with the first protruding part 29 interposed therebetween, one more second protruding part (second protrusion) 32 is disposed on the surface of the ferrite substrate 28, and protrudes into the ferrite resin layer 20 from the surface of the ferrite substrate 28. The second protruding part 32 is arranged on the periphery of the winding 22 that winds around the circumference of the first protruding part 29. The IC 53 is arranged inside resin layers 52 and 54 such that the plane of projection of the IC 53 on the surface of the ferrite substrate 28 overlaps the cross-section of the second protruding part 32 at the surface of the ferrite substrate 28. The IC 53 is arranged by shifting the IC 53 such that the center portion of the IC 53 does not overlap the center portion of the first protruding part 29. The arrangement of the vias 64 is shown in FIG. 14.

In this embodiment, the IC 53 is arranged on top of the first protruding part 29 and three second protruding parts 30, 31 and 32, which fluctuate little in height as a result of thermal expansion, making it possible to more stably arrange the IC 53 than in the fifth embodiment. Furthermore, as shown in FIG. 14, arranging the IC 53 in this embodiment by shifting the IC 53 such that the center portion of the IC 53 does not overlap the center portion of the first protruding part 29 makes it possible to provide more surface area for the disposition of vias 64 than in the fifth embodiment shown in FIG. 12, and to enhance the degrees of freedom of the interconnects.

The embodiments of the present invention have been explained above, but the present invention is not limited to the above-described embodiments, and a variety of modifications are possible.

What is claimed is:

1. An electronic component module comprising:
   a substrate;
   a first resin layer, which is disposed on the substrate;
   a coil, which is embedded within the first resin layer;
   a second resin layer, which is disposed on top of the first resin layer; and
   an IC, which is embedded within the second resin layer,
   wherein the substrate has a first protrusion, which is made of ceramics and protrudes into the first resin layer from a surface of the substrate,
   the coil is arranged inside the first resin layer so as to wind around a circumference of the first protrusion, and
   the IC is arranged inside the second resin layer so as to overlap with the first protrusion.

2. The electronic component module according to claim 1, wherein the IC is arranged such that a plane of projection of the IC on the surface of the substrate juts out beyond a cross-sectional area of the first protrusion at the surface of the substrate.

3. The electronic component module according to claim 2, wherein the substrate further comprises a second protrusion, which is made of ceramics, protrudes into the first resin layer from the surface of the substrate, and is arranged on a periphery of the coil that winds around the circumference of the first protrusion, and
   the IC is arranged inside the second resin layer spanning the first protrusion and the second protrusion.

4. The electronic component module according to claim 1, wherein the IC is arranged such that a plane of projection of the IC on the surface of the substrate is inside a cross-sectional area of the first protrusion at the surface of the substrate.

5. The electronic component module according to claim 4, wherein the substrate further comprises a second protrusion, which is made of ceramics, protrudes into the first resin layer from the surface of the substrate, and is arranged on a periphery of the coil that winds around the circumference of the first protrusion, and
   the IC is arranged inside the second resin layer spanning the first protrusion and the second protrusion.

6. The electronic component module according to claim 1, wherein the substrate further comprises a second protrusion, which is made of ceramics, protrudes into the first resin layer from the surface of the substrate, and is arranged on a periphery of the coil that winds around the circumference of the first protrusion, and
   the IC is arranged inside the second resin layer spanning the first protrusion and the second protrusion.

* * * * *